United States Patent [19]

Bird

[11] Patent Number: 5,912,578
[45] Date of Patent: Jun. 15, 1999

[54] MULTIPLEXER CIRCUIT HAVING DIODE BRIDGE SWITCHES

[75] Inventor: Neil C. Bird, Horley, United Kingdom

[73] Assignee: U.S. Philips Corporation, New York, N.Y.

[21] Appl. No.: 08/781,573

[22] Filed: Jan. 9, 1997

[30] Foreign Application Priority Data

Jan. 11, 1996 [GB] United Kingdom ................... 9600543

[51] Int. Cl.$^6$ ........................ H03K 17/00; H03K 17/74
[52] U.S. Cl. ...................... 327/407; 327/494; 250/208.1; 348/308
[58] Field of Search .................................. 327/407, 423, 327/494, 587, 92, 99; 250/208.1; 348/308

[56] References Cited

U.S. PATENT DOCUMENTS

| 3,059,228 | 10/1962 | Beck et al. | 340/179 |
|---|---|---|---|
| 3,098,214 | 7/1963 | Windes et al. | 340/147 |
| 3,389,272 | 6/1968 | Cherry | 307/257 |
| 3,737,680 | 6/1973 | Uchida | 327/495 |
| 3,916,392 | 10/1975 | Richardson | 340/173 |
| 4,150,256 | 4/1979 | Bernet et al. | 327/496 |
| 4,518,921 | 5/1985 | Logan | 327/92 |
| 4,659,945 | 4/1987 | Metz | 327/92 |

*Primary Examiner*—Timothy P. Callahan
*Assistant Examiner*—Eunja Shin
*Attorney, Agent, or Firm*—Steven R. Biren

[57] ABSTRACT

An array of electrical elements is arranged in rows and columns, signals being read out from the column conductors. Each column has a multiplexer switch so that signals from a number of columns may be switched to a common output. Each multiplexer switch comprises a diode bridge (36–39) having an input (60) and an output (34). Current is supplied to the diode bridge through a supply diode (52) and drained from the bridge through a drain diode (54), for controlling the switching of the bridge. The all-diode switch may be integrated on the substrate of the array and has a substantially linear switching response.

9 Claims, 4 Drawing Sheets

MULTIPLEXER CIRCUIT HAVING DIODE BRIDGE SWITCHES

BACKGROUND OF THE INVENTION

This invention relates to multiplexer circuits and to arrays of device elements arranged in rows and columns, and having column multiplexer circuits. In particular, the device elements are image sensor elements of a large area image sensor.

It is known to provide row or column multiplexers for addressing or reading an array of electronic devices. Such multiplexer circuits generally comprise an array of switches which selectively couple one of the switch inputs to a common output.

Various types of switch are available which may be used to form multiplexer circuits. One type of switch involves the use of a diode bridge having four diodes, the four connection points around the bridge defining an input, output and two control terminals. The control terminals enable the four diodes to be switched between forward bias, when the input is linked to the output, and reverse bias, when the output is isolated from the input. The use of such a switch as a voltage switching element is disclosed, for example, in the following documents:

U.S. Pat. No. 4,150,256 (e.g. FIG. 3) discloses a multiplexer circuit comprising an array of switches, each switch comprising the diode bridge having four diodes which are selectively forward biased or reversed biased by the application of control voltages to two control terminals. The two control terminals are connected to opposite ends of a transformer secondary winding. In this way, a current supplied to the diode bridge by the transformer winding is equal to a current drawn from the diode bridge. The circuit suffers from the drawback that a transformer must be provided for each switch, and the circuit is therefore not suitable for integration onto a large area circuit substrate.

U.S. Pat. No. 4,518,921 discloses a sample and hold switch in which the diode bridge is turned on and off by respective pairs of current sources. Again, these ensure that the currents supplied to and withdrawn from the diode bridge are equal. The sample and hold switch of U.S. Pat. No. 4,518,921 has an output capacitor so that the output voltage may rise or fall to follow the input voltage, when the diode bridge switch is in the ON state.

In order for the diode bridge to function correctly in transferring the input voltage to the output voltage, the voltages at the control terminals of the diode bridge must not be fixed, and in the above cases a transformer secondary winding may be used (which provides a floating voltage) or current sources may be provided (which provide a constant current independently of the voltage across them).

U.S. Pat. No. 3,059,228 discloses another use of a diode bridge sampling switch in which the control terminals of the diode bridge are allowed to float in dependence upon the input voltage, through the use of a diode and resistive network. The network includes two voltage source pairs for controlling the switching ON and OFF of the diode bridge. The switch functions to transfer an input voltage through the switch to the output terminal, which has a charge storage element enabling the output voltage to rise or fall following the input voltage. When the switch is turned ON, resistive feed from high voltage sources ensures that substantially constant and equal currents are supplied to and drained from the diode bridge.

The present invention seeks to provide a multiplexer circuit for an array of electrical devices using diode bridge switches which may be integrated, together with their respective supply circuitry, onto the substrate of the array of electronic devices, and which multiplexer circuit may be used to switch a current from the input of the diode bridge to the output. The prior art discussed above does not address the particular problems associated with integration of the circuit onto an array of electrical elements, nor with the use of the diode bridge as a current switching device.

For the current at the output of the diode bridge to be equal to the input current, the current supplied to the diode bridge by the control circuitry must be equal to the current withdrawn from the diode bridge. This follows from the basic principle that the total current flowing into the circuit must equal the total current flowing out of the circuit (Kirchhoff's current law). Therefore, if the diode bridge circuit is to be used as a current switch, it would be expected that either the supply terminals of the diode bridge must be coupled together, for example in the manner shown in U.S. Pat. No. 4,150,256, or that equal current sources must be provided, for example in the manner shown in U.S. Pat. No. 4,518,921.

SUMMARY OF THE INVENTION

The present invention is based on the realisation that coupling of the control circuitry to the diode bridge via very highly non-linear resistive elements may result in an output current which is proportional to the input current.

According to the present invention, there is provided a multiplexer circuit comprising a plurality of multiplexer switches each for switching a current signal between an input of the switch and a common terminal, each switch comprising:

a respective diode bridge having first and second arms each extending between a supply node of the diode bridge and a drain node of the diode bridge, each arm comprising a respective pair of diodes coupled together at a respective node of that arm and having the same polarity as each other between the supply and drain nodes, the respective input of the switch being coupled to the node of the first arm, the common terminal being coupled to the node of the second arm;

a supply control line coupled to the supply node of the diode bridge through a supply diode; and a drain control line coupled to the drain node of the diode bridge through a drain diode, the supply and drain diodes having the same polarity as the diodes of the diode bridge, the control lines applying switching voltages for switching the diodes between forward bias in a first state of the bridge and reverse bias in a second state of the bridge, whereby a current signal is transmitted between the input of the switch and the common terminal in the first state of the diode bridge.

The use of diodes, despite their highly non-linear characteristics, as the resistive connection of the supply and drain nodes to the control lines enables the multiplexer circuit to be fabricated from all-diode technology and to be integrated on to the substrate of the electronic device array.

The invention also provides an electronic device comprising an array of charge storage elements which are arranged in rows and columns and which are coupled to row and column conductors, the column conductors being arranged in at least one group, each group having a respective common terminal, a column multiplexer circuit of the invention coupling the column conductors of a respective group to the respective common terminal, the input of each multiplexer switch comprising a respective column conductor, and a charge measurement device which clamps the potential of the common terminal to a fixed potential and which measures the flow of charge from the common terminal.

Preferably, a clamping switch is coupled to the respective column conductor for clamping the potential of the column conductor in the second state of the bridge.

The charge measurement device clamps the output of the diode bridge to a fixed voltage, so enabling the output current of the diode bridge to be measured, preventing the output voltage altering as a result of the flow of charge at the input of the switch.

The multiplexer circuit in accordance with the present invention can have a fast switching speed determined by low values of diode capacitances. The multiplexer circuits can, for example, be designed for use with the column conductors of an image sensor array.

The electronic device is preferably an image sensor.

BRIEF DESCRIPTION OF THE DRAWINGS

These and other features of the present invention, and their advantages, are illustrated specifically in embodiments of the invention now to be described, for example, with reference to the accompanying drawings, in which.

It should be noted that all of the drawings are diagrammatic and not drawn to scale.

DESCRIPTION OF THE PREFERRED EMBODIMENTS

The invention provides an array of charge storage elements arranged in rows and columns, signals being read out from the column conductors. Each column has a multiplexer switch, shown in FIG. 3, so that signals from a number of columns may be switched to a common output. Each multiplexer switch comprises a diode bridge (36–39) having an input (60) and an output (34). Current is supplied to the diode bridge through a supply diode (52) and drained from the bridge through a drain diode (54), for controlling the switching of the bridge. The all-diode switch may be integrated on the substrate of the array and has a substantially linear switching response.

Figure 1:
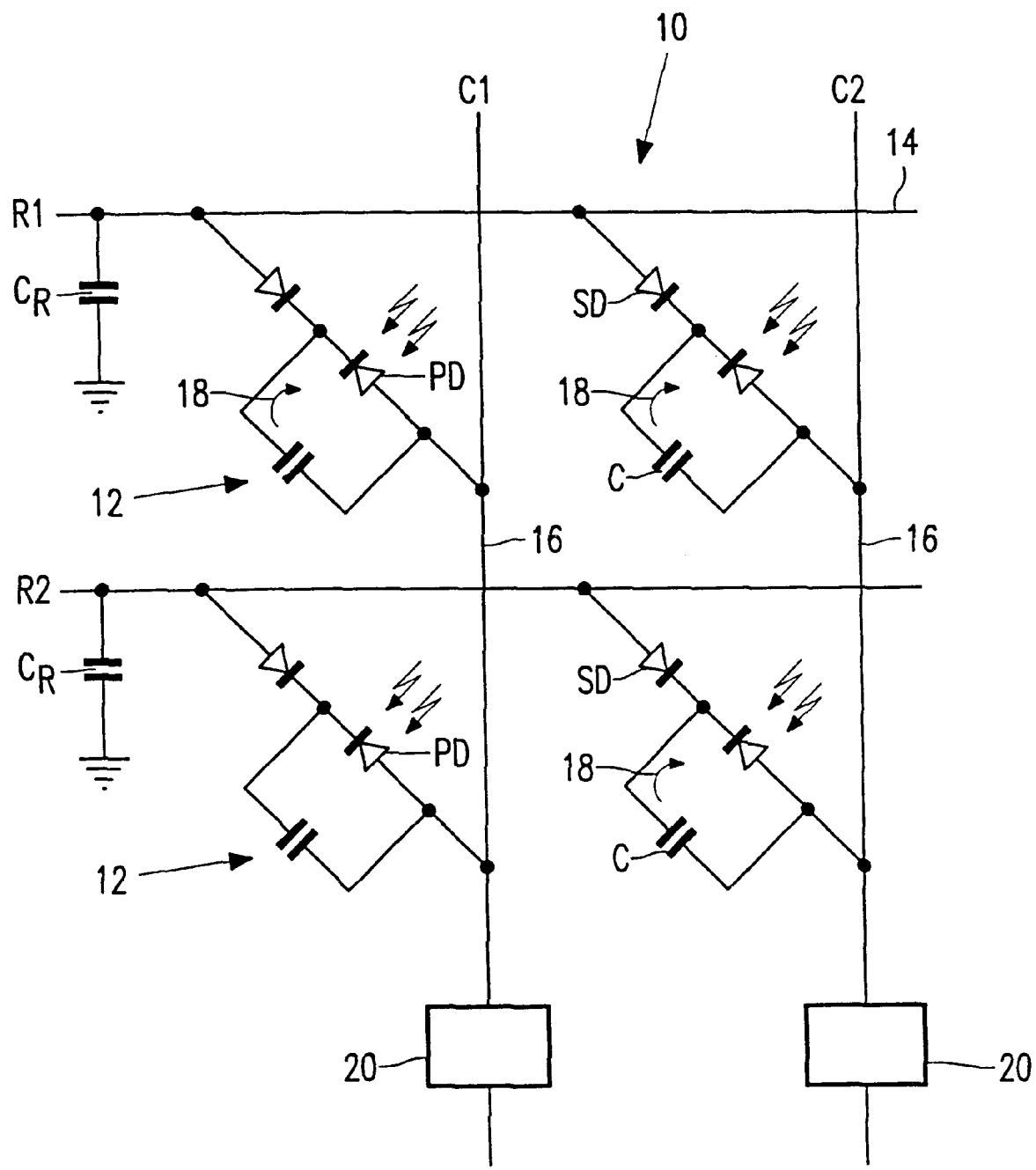
FIG. 1 is a diagram to explain the operation of an image sensor pixel.

FIG. 1 shows an example of four pixels of a known charge storage device in the form of an image sensor 10. Although only four pixels 12 are shown, the image sensor 10 will comprise a two dimensional matrix of rows and columns of pixels with associated row 14 and column 16 conductors.

Each pixel 12 comprises a photosensitive diode PD and a switching diode SD coupled in series between the associated row conductor 14 and column conductor 16. In the example shown, the switching diode SD and photodiode PD are arranged with the cathodes coupled together, although they may be connected oppositely. A capacitor C is shown coupled across the photosensitive PD. This capacitor C may be the parasitic capacitance of the photosensitive diode PD or may be an additional capacitor added to increase the dynamic range of the image sensor 100.

If a photodiode is held reverse biased and is electrically isolated, then light incident upon the photodiode will generate a minority carrier current in the photodiode as shown by arrow 18.

This current may be read out either by directly measuring the photodiode current produced while the switching diode is forward biased, or the photodiode current may be allowed to discharge the capacitance C during a so-called integration period, the level of illumination being determined by the current required to subsequently recharge the capacitor. In either case, the current is measured using charge sensitive amplifiers 20 coupled to the column conductors.

A known problem with image sensor arrays is that since the row driver circuit and column reading circuit are not integrated onto the substrate of the image sensor array, interconnections must be provided between each row R and the row driver circuit, and between each column C and the column reading circuit. Multiplexer circuits are therefore required which may be integrated onto the substrate of the image sensor so as to reduce the number of outputs from the substrate.

Figure 2:
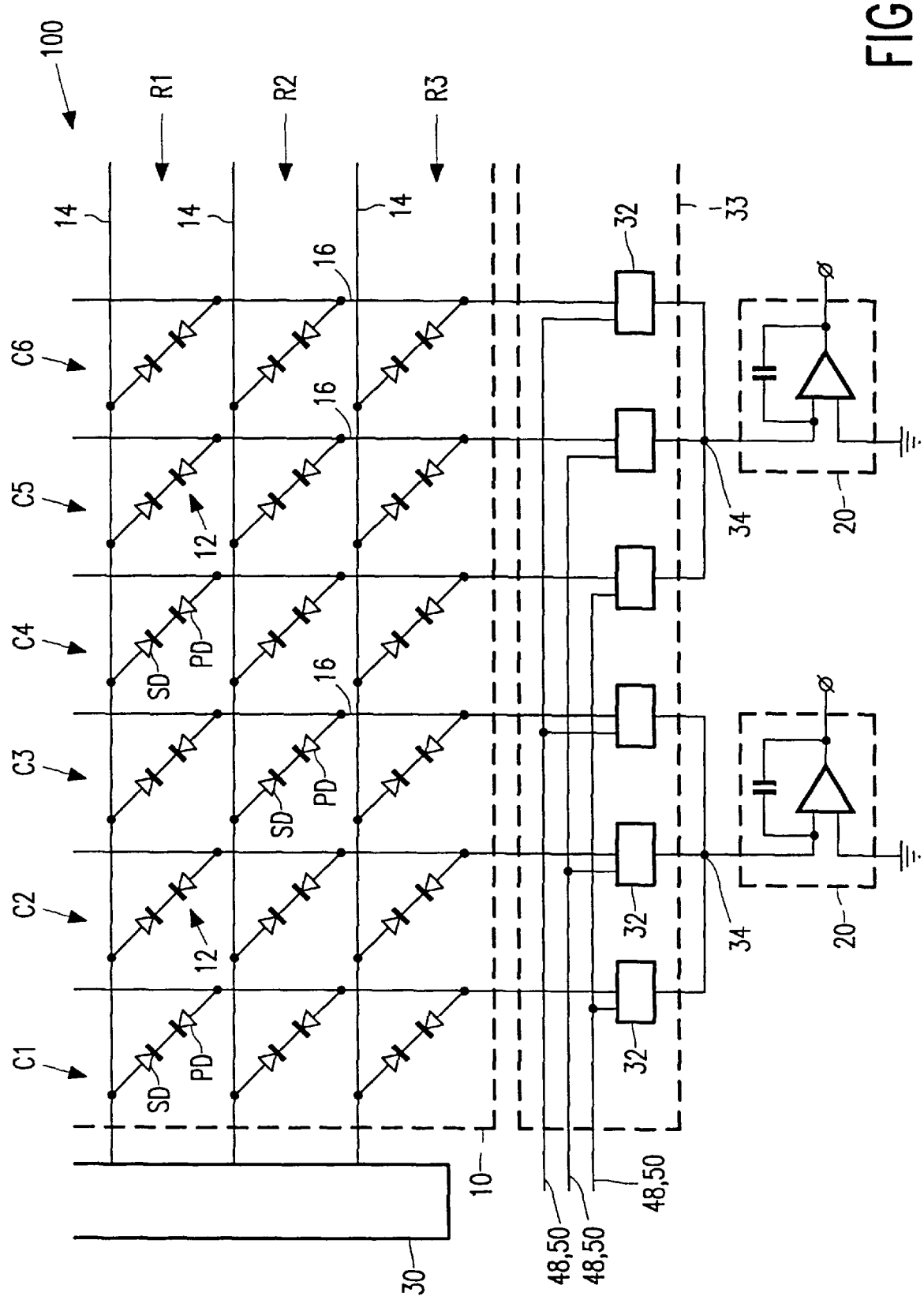
FIG. 2 is a simple circuit diagram of part of an image sensor device in accordance with the present invention, and having a column multiplexer circuit.
Figure 3:
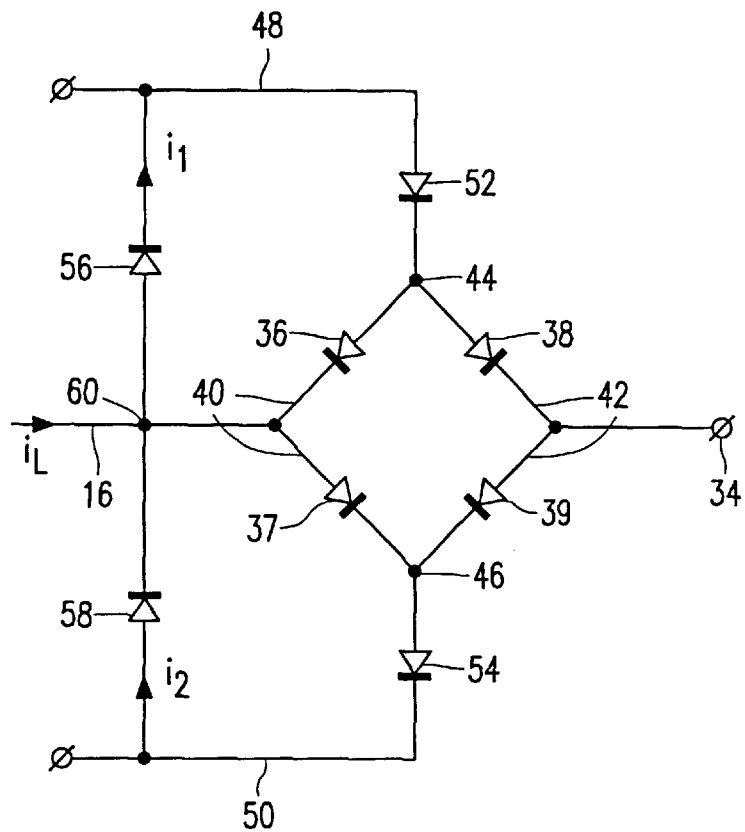
FIG. 3 is a circuit diagram of one multiplexer switch of the multiplexer used in the circuit of FIG. 2.

FIGS. 2 and 3 show an image sensor using a column multiplexer circuit, in accordance with the invention.

The image sensor 100 shown in FIG. 2 comprises an array 10 of image sensor pixels 12 corresponding to those shown in FIG. 1. For the purposes of clarity, the capacitances associated with the photodiodes have not been shown in FIG. 2. A row driver circuit 30 is provided for producing line-scan pulses which are applied sequentially to the row conductors 14, to sequentially address the rows R of the array. As explained with reference to FIG. 1, these line-scan pulses serve for forward biasing the switching diodes SD of the addressed row.

The columns C are arranged in groups, such as group C1 to C3 and group C4 to C6. Each such group has a respective common terminal 34. The column conductor 16 for each column is connected to an associated multiplexer switch 32 which couples the column conductor 16 to the common terminal 34. In this way, the multiplexer switches 32 transmit the signal from a selected column conductor 16 through to the common terminal 34. Thus, the photo-generated signal from the photo diode PD of a selected row is transmitted through the forward biased switching diode SD to the column conductor, and is read via the respective column multiplexer switch 32. The multiplexer switches 32 together form column multiplexer circuit 33. The charge sensitive amplifier 20 is connected to the common terminal 34 to read this photo generated signal in known manner.

The charge sensitive amplifiers 20 may be formed as monolithic silicon integrated circuits, separate from the device substrate on which the array 100 and column multiplexer switches 32 may be formed by thin film circuitry. Thus, the common terminals 34 may be the output terminals of the device substrate. Similarly, the row driver circuit 30 may be formed as a monolithic silicon integrated circuit, so that the connections between the row driver circuit 30 and the row conductors 14 may also be output terminals of the device substrate. It may also be possible to form at least part of the row driver circuit 30 and/or charge-sensitive amplifiers 20 in thin film circuitry, which may therefore be formed on the same device substrate as the array 100.

The multiplexer switches 32 are shown only schematically in FIG. 2, and FIG. 3 shows the circuit diagram for each multiplexer switch 32.

The multiplexer switch 32 comprises a diode bridge formed from diodes 36 to 39, arranged in the form of two arms 40 and 42 each extending between a supply node 44 and a drain node 46 of the diode bridge. Each arm 40, 42 comprises a pair of the diodes 36 to 39 connected in series and having the same polarity as each other between the supply node 44 and the drain node 46. The column conductor 16 is connected to the first arm 40 at the point of connection of diodes 36 and 37. The output of the diode bridge, which is connected to the common terminal 34, is connected to the second arm 42 at the point of connection of the two diodes 38 and 39. Control lines 48 and 50 are provided for applying switching voltages to switch the diodes 36 to 39 of the diode bridge between forward bias in a first state of the bridge, and reverse bias in a second state of the bridge. In this way, a signal is transmitted between the column conductor 16 and the common terminal 34 in the first state of the bridge, and is not transmitted in the second state of the diode bridge. The control of the diode bridge will be described in the following passages.

The use of a diode bridge as a switching device is known. For example, such diode bridge switches are used for switching voltages between an input and an output in U.S. Pat. No. 4,518,921. When the diode bridge is to be used for switching voltages, the potential of the supply node 44 and drain node 46 must not be fixed, otherwise the output voltage will not be free to follow the input voltage. Therefore, when using this type of diode bridge as a voltage switching device, it has been proposed to supply and drain the diode bridge with current sources, which provide a constant current independently of the voltage across them. Alternatively, it has been proposed, for example in U.S. Pat. No. 4,150,256, to connect the supply node and the drain node of the diode bridge to opposite ends of a transformer secondary winding. This provides a constant voltage drop across the diode bridge but does not fix the potential of the supply node or drain node. Clearly, it is undesirable or impractical to require current sources or transformers for each multiplexer switch when the diode bridge switch is to be integrated onto the substrate of an integrated large area electronic array.

When the diode bridge switch is to be used for switching a voltage as in the prior art, a charge storage device is preferably provided at the output of the diode bridge to hold the voltage reached at the output. When the diode bridge has reached a stable condition, no current flows to the output so that, in the second arm 42 of the diode bridge, an equal current flows in the two diodes 38, 39 of that arm. Therefore, the voltages across the two diodes are equal (assuming the two diodes are equivalent) and the output voltage is centred between the voltages of the supply node 44 and the drain node 46. Since the circuit is arranged such that the current supplied to the drain node 44 is equal to the current drained from the drain node 46, no current flows into the input. As a result, the input voltage is also centred between the voltages of the supply node 44 and the drain node 46. Thus, the current supplied to the bridge must be equal to the current drained from the bridge in order that the output voltage reaches a stable condition when equal to the input voltage.

Figure 4:
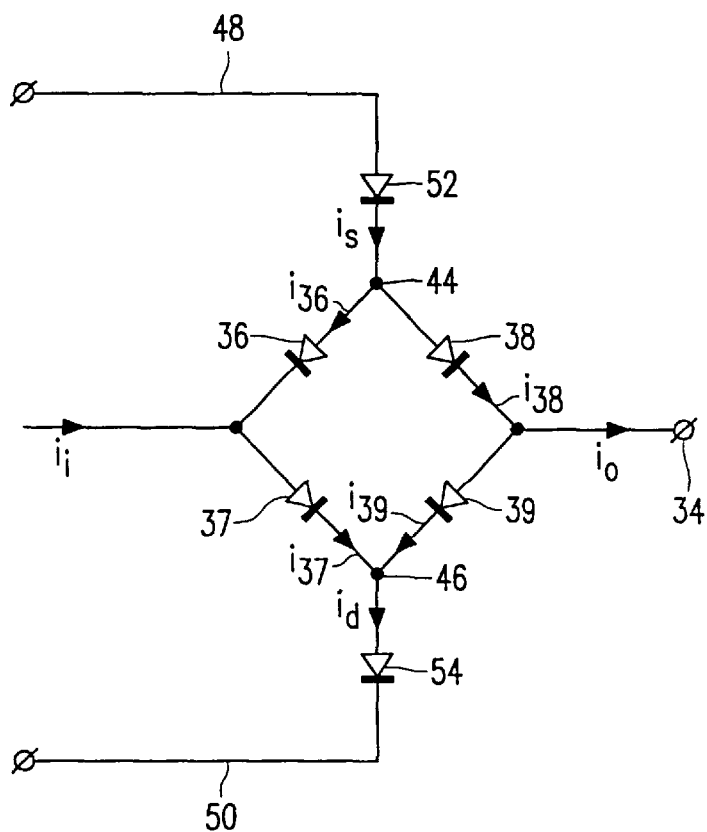
FIG. 4 is a diagram to explain the current switching characteristics of the multiplexer switch of FIG. 3.

The use of a diode bridge switch as a component for a multiplexer circuit of an image sensor array requires the switch to provide an output current corresponding to the input current, rather than acting as a voltage switch. This gives rise to the same requirement for equal supply and drain current, as will be explained with reference to FIG. 4, which is a diagram to explain the operation of the diode bridge in switching a current between the input and the output.

Let:
$i_i$=input current to be switched to the output
$i_o$=output current
$i_s$=current supplied to supply node 44
$i_d$=current drained from drain node 46
$i_{36}, i_{37}, i_{38}, i_{39}$=currents flowing in diode 36 to 39.

Then:
summing currents at supply node 44:

$$i_{38}=i_s-i_{36} \qquad (1)$$

summing currents at input:

$$i_i=i_{37}-i_{36} \qquad (2)$$

summing currents at drain node 46:

$$i_{39}=i_d-i_{37} \qquad (3)$$

summing currents at output:

$$i_o=i_{38}-i_{39} \qquad (4)$$

substituting (1) and (3) into (4) gives $$i_o=i_i+i_s-i_d \qquad (5)$$

This also follows by considering the currents flowing into and out of the diode bridge circuit as a whole.

Equation 5 shows that the supply current and the drain current must be equal in order for the output current from the diode bridge to be equal to the input current. If the currents $i_s$ and $i_d$ vary (differently) according to a change in the input current, then the output current will not follow the input current. As a result, the use of equal current sources as the supply to, and the drain from, the diode bridge would seem appropriate if the diode bridge is to be used for switching currents. Alternatively, connecting the supply node 44 and drain node 46 to opposite ends of a transformer secondary winding would ensure that the currents at the supply and drain of the diode bridge are always equal.

Referring back to FIG. 3, the multiplexer switch 32 of the invention in fact comprises a supply diode 52 connected between the supply control line 48 and the supply node 44 of the diode bridge, and a drain diode 54 connected between the drain node 46 of the diode bridge and the drain control line 50. The supply and drain diodes 52, 54 have the same polarity as the diodes of the diode bridge, and are therefore forward biased when the control lines 48, 50 are operated so as to forward bias the diodes of the diode bridge. Thus, when the multiplexer switch 32 is in the ON state, and the diode bridge is conducting, the supply and drain diodes also conduct.

The supply diode and drain diode used in the multiplexer switch 32 of the invention do not force the supply current and drain current to be equal. Indeed, the currents flowing through these two diodes will vary depending upon the input voltage, which will vary as the input current varies. In particular, the input voltage will determine the voltages at the supply node 44 and drain node 46 and will therefore determine the potential drop across the supply diode 52 and drain diode 54. These diodes do not have linear current-voltage characteristics. In particular, amorphous silicon diodes do not have a linear response even when the diode is strongly forward biased.

The present invention is based on the realisation that a current switching characteristic may be obtained which approaches linearity, despite the non-ohmic resistive feed of the diode bridge. This linearity may be expected when the input current received from the column conductors is very small compared to the switching currents flowing in the diode bridge when in the ON state. However, the circuit of the invention maintains a substantially linear response even when the input current (from the column conductors) approaches the quiescent currents flowing in the diode bridge. The linearity of the circuit is demonstrated with reference to FIGS. 5 to 7, as is described in the following.

The output of the diode bridge is connected to the common terminal 34 and therefore connected to the charge sensitive amplifier 20. The charge sensitive amplifier comprises an integrating amplifier, having a capacitive feed back loop, and with the input held at a fixed potential. Thus the charge sensitive amplifier may comprise an Operational Amplifier, with one terminal earthed, and the other terminal connected to the common input and to the output through a capacitive load. The feedback loop may also include a resetting switch which may be used to reset the output at the earthed potential. Thus, the output of the diode bridge is held at zero volts which prevents the output voltage following the input voltage of the diode bridge and also prevents significant shift of the voltage levels at the supply node 44 and drain node 46. This contributes in maintaining substantially constant currents supplied to the supply node 44 and drain 46 through the supply diode 52 and drain diode 54.

As illustrated in FIG. 2, the columns C are arranged in groups. As is evident from the multiplexer switch 32 shown in FIG. 3, each switch requires a pair of control lines 48, 50, and one multiplexer switch 32 must be independently selectable from those switches 32 for a group of columns. Thus, the multiplexer switches in a group are supplied with individual control lines 48, 50, as shown in FIG. 2. However, the column multiplexer switches 32 for different groups of columns C share common control lines 48, 50 so as to reduce the number of such control lines in the multiplexer circuit. These control lines, 48, 50 may extend to output terminals on the device substrate, or they may be connected to a control circuit formed in thin-circuitry on the same device substrate. The control circuit generates sequences of voltage pulses for switching the multiplexer switches 32 sequentially within each group of columns.

Referring again to FIG. 3, each multiplexer switch 32 preferably also comprises a clamping switch comprising diodes 56, 58 coupled to the respective column conductor 16 in the non-transmitting state of the diode bridge. In the example illustrated in FIG. 3, the diodes 56, 58 are coupled between the control lines 48, 50 with an opposite polarity to the polarity of the bridge diodes 36 to 39. The clamping diodes 56, 58 are coupled together at a clamping node 60 with the column conductor 16, for clamping the potential of the column conductor when the bridge is in the non-transmitting state.

When the diode bridge is in the ON state, the diodes 56, 58 of the clamping switch are reversed biased and play no role in the operation of the switch. However, when the diode bridge is in the OFF state, and voltages have been applied to the control lines 48, 50 so as to reverse bias the diode 36 to 39 of the bridge and the supply and drain diodes, the diodes of the clamping switch act as a voltage clamp, clamping the column conductor 16 to a constant potential. This constant potential is zero volts, in the assumed situation where the voltage is applied to the control lines 48, 52 are of equal magnitude and of opposite polarity, and when the clamping diodes 56, 58 have the same switching characteristics. The clamping effect can best be understood by considering the device elements PD, SD of the various rows which are coupled to this column conductor 16. Thus, for example, the multiplexer circuit 32 shown in FIG. 3 may be the multiplexer switch for column 1 shown in FIG. 2, and the pixels of row 1 may be addressed by a negative voltage scanning pulse on the row conductor 14 for row R1. In this case, the switching diode SD of row 1, column 1 is forward biased and the switching diodes SD of all the other rows R2, R3, etc. in the column C1 are reversed biased. Although its switching diode SD is forward biased, the image signal of pixel 1, is not read out by the charge-sensitive amplifier because the respective multiplexer switch 32 is in a blocking state. Although the switching diodes SD of the other rows of column C1 are reverse biased, there is still a small leakage current through these diodes. In the clamping state of the diodes 56, 58, leakage currents $i_L$ which result from the image signal of pixel (R1, C1) and the leakage current through the switching diodes SD of the other rows of column C1 which may be present on the column conductor 16 are drained safely away via the forward biased diodes 56 and 58. Thus, summing the current at the clamping node 60 as shown in FIG. 3, $$i_1 = i_2 + i_L$$

Where $I_1$ and $i_2$ are the currents through the forward biased clamping diodes 56, 58 respectively. In the absence of these forward-biased clamping diodes 52 and 54, these currents would cause the potential of the column conductor 16 to vary and so could change the bias conditions of the pixels in non addressed rows R2, R3, etc. of column C1. When these pixels in the non addressed rows, R2, R3 etc. are later addressed, a false signal (not representative of the image illumination incident on these pixels) may be read out as a result of these changed biased conditions. This undesirable effect is avoided by the provision of a clamping switch as shown.

Figure 5:
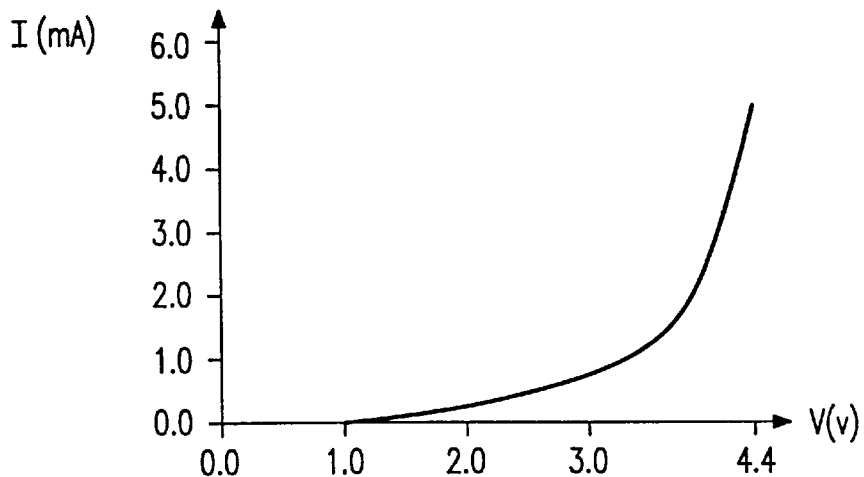
FIGS. 5 to 7 give an analysis of the relationship between the output current and the input current of the multiplexer switch of FIG. 3 for particular diode characteristics.
Figure 6:
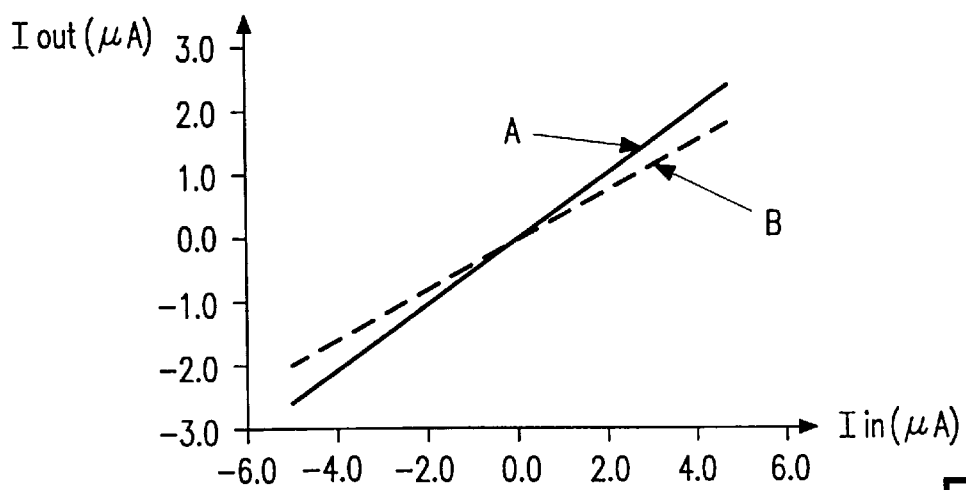
Figure 7:
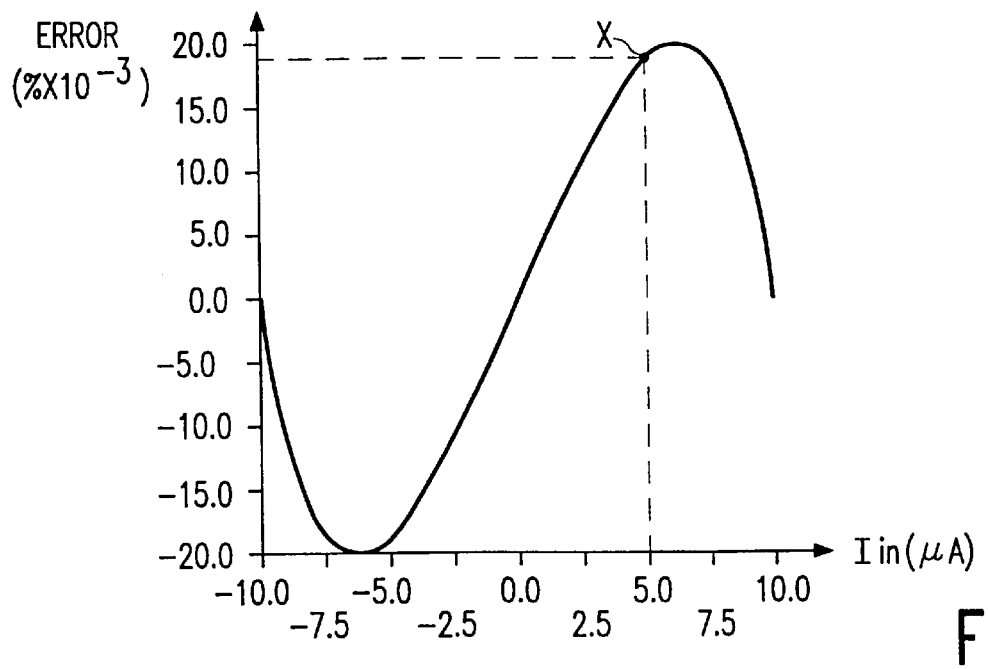

FIGS. 5 to 7 are graphs used for analysing the linearity of the multiplexer switch 32.

FIG. 5 shows a diode current-voltage characteristic, which characteristic is used in a circuit model of the multiplexer switch 32 to represent each of the diodes in the diode bridge and including the supply diode and drain diode. This model is based on a quadratic response, which provides a reasonably accurate model of the diode characteristics, particularly for diodes which are forward biased with a forward bias greater than approximately 2 volts. FIG. 6 is a graph representing the output current which is provided by the diode bridge in response to a varying input current. Curve A represents the response obtained for a perfectly linear diode characteristic (in other words each diode is represented by an ohmic resistor), and curve B represents the switching characteristic of the multiplexer switch 32 with the diodes modelled by the characteristic shown in FIG. 5. As can be seen, the response of the multiplexer switch 32 remains linear. With linear and identical diodes (Curve A) the gain of the circuit is 0.5, whereas the gain drops slightly when the circuit simulation uses the non linear diode model.

The surprising linearity of the response of the multiplexer switch 32 could be explained as a small signal effect when the photodiode currents are very much smaller than the diode bridge currents. However, the response remains substantially linear even for an input current to the diode bridge greater than 50% of the value of the quiescent currents flowing in the diodes of the diode bridge.

FIG. 7 shows the percentage deviation from a linear response of the multiplexer switch 32 as a function of the input current. It is assumed that some gain correction has been introduced so that for input currents of −10 $\mu$A and +10 $\mu$A, any error is eliminated. In other words, the error represents the derivation from a linear response, but not the drop in the gain when compared to the ohmic model. Taking point X as an example, this diagram shows that for an input current of 5 $\mu$A, the maximum deviation of the response of the multiplexer switch 32 from a perfectly linear response is 0.02%, based on the diode model of FIG. 5, which is representative of the level of non-linearity of a practical diode. When the same analysis is carried out for input currents ranging from −100 $\mu$A to +100 $\mu$A, the maximum error is of the order of 1%. The model used in this simulation give rise to quiescent currents flowing in the forward biased diode bridge of 150 $\mu$A, so that the input current represents 67% of the quiescent currents. Thus, the response remains substantially linear even if the quiescent currents are reduced to the same order of magnitude as the input current. As a result, the size of the diodes may be reduced in response to a drop in the required quiescent currents.

The use of a multiplexer circuit in accordance with the invention enables the multiplexing circuitry to be formed from all-diode technology and therefore to be integrated easily with the electrical elements of the array. In particular, where the array comprises image sensor pixels in the form of photodiodes, the same processing steps may be used to fabricate the diodes of the multiplexer switches 32 as for the image sensor pixels 12. There is no need to form current sources to supply and drain the diode bridge, or to provide transformer windings. Furthermore, switching of the multiplexer switch 32 does not involve switching current sources or changing the voltages on transformer windings, and the response of the multiplexer switch 32 may be much faster than alternative arrangements.

Although the gain of the multiplexer switch 32 has a theoretical maximum of 0.5, the actual gain of the circuit may be maintained close to this theoretical maximum by reducing the area of the supply diode and drain diode, therefore increasing their forward resistance.

When the diode bridge is switched on, and the diodes 36 to 39 are forward biased, the current supplied to the supply node 44 and drained from the drain node 46 must be at least equal to the input current in order that the diodes are correctly biased when switching a current. Since the input current is a small magnitude photodiode current, this does not require the supply diode or the drain diode to have a prohibitively large size. Indeed, with appropriate selection of the control voltages applied to the control lines 48, 50, the multiplexer switch 32 may occupy a very small area. For example, the diodes may have dimensions of 100 micrometers×100 micrometers or even smaller.

Thus, the multiplexer switches 32 may be fabricated in thin-film technology. For example, all of the diodes of the multiplexer switcher 32 may be amorphous silicon N-I-P diodes formed by depositing, in sequence, N-type conductivity, intrinsic and P-type conductivity amorphous silicon layers.

In FIG. 2, only three rows and six columns are shown. An image sensor in accordance with the present invention may typically have several hundred or thousand rows and columns. FIG. 2 shows the columns C arranged in groups of three. However, an image sensor in accordance with the present invention may have more than three column conductors 16 grouped together and coupled by the multiplexer switches 32 to the column terminal. Alternatively, there may be provided a single group which will allow a greater multiplexer ratio.

Because the columns of a group are read out sequentially to the common terminal 34, the read out speed for the array decreases with the number of columns in each group. Thus, for an image sensor with a given number of columns, the number of groups is chosen in accordance with the desired read out speed.

FIG. 3 shows single diodes 36 to 39 in each arm of the bridge, single clamping diodes 52, 54 and single supply and drain diodes 44, 46. However, two diodes or more in series may be used instead of these single diodes.

The device elements of the array 100 may comprise thin-film transistors. Thus, for example, each pixel may comprise a known arrangement of two switching transistors and a photo conductor. In this case, the diodes of the multiplexer circuit 32 may be formed as diode-connected thin-film transistors, i.e. a gate and drain of the transistor may be coupled together as one electrode of the circuit element. Furthermore, when transistors are used, the clamping arrangement may be a single transistor having its source coupled to the column conductor 16, its drain coupled to a clamping voltage line and its gate coupled to a control line for switching the transistor on and off in opposite synchronisation with the diode bridge 36 to 39.

An image sensor in accordance with the present invention may be designed as a document scanner. A very large area image sensor may be formed capable of scanning an A4 page at a resolution of 300 dpi (dots per inch).

The terminology "columns" and "rows" for an array is somewhat arbitrary, and the use of the terms row and column should merely be understood as representing a two dimensional array of device elements.

From reading the present disclosure, other modifications will be apparent to persons skilled in the art. Such modifications may involve other features which are already known in the design and use of electrical or electronic circuits and component parts thereof and which may be used instead of or in addition to features already described herein.

I claim:

1. An electronic device comprising an array of charge storage elements which are arranged in rows and columns and which are coupled to row and column conductors, the column conductors being arranged in at least one group, each group having a respective common terminal, a column multiplexer circuit comprising a plurality of multiplexer switches each for switching a current signal between an input of the switch and a common terminal, each switch comprising:

a respective diode bridge having first and second arms each extending between a supply node of the diode bridge and a drain node of the diode bridge, each arm comprising a respective pair of diodes coupled together at a respective node of that arm and having the same polarity as each other between the supply and drain nodes, the respective input of the switch being coupled to the node of the first arm and the common terminal being coupled to the node of the second arm;

a supply control line coupled to the supply node of the diode bridge through a supply diode; and a drain control line coupled to the drain node of the diode bridge through a drain diode, the supply and drain diodes having the same polarity as the diodes of the diode bridge, the control lines applying switching voltages for switching the diodes between forward bias in a first state of the bridge and reverse bias in a second state of the bridge, whereby a current signal is transmitted between the input of the switch and the common terminal in the first state of the diode bridge, said column multiplexer circuit coupling the column conductors of a respective group to the respective common terminal, the input of each multiplexer switch comprising a respective column conductor, and a charge measurement device which clamps the potential of the common terminal to a fixed potential and which measures the flow of charge from the common terminal.

2. An electronic device circuit as claimed in claim 1, wherein each multiplexer switch further comprises a clamping switch coupled to the respective input for clamping the potential of the input in the second state of the diode bridge.

3. An electronic device circuit as claimed in claim 2, wherein the clamping switch for each multiplexer switch comprises a pair of clamping diodes coupled between the control lines with an opposite polarity to the polarity of the bridge diodes, the clamping diodes being coupled together at a node with the input of the switch for clamping the potential of the input when the bridge is in the second state.

4. An electronic device according to claim 1, in which the charge storage elements of the array comprise diodes, and the diodes of the column multiplexer circuits are of the same technology type as the diodes of the array.

5. An electronic device according to claim 4, in which the diodes of the array and of the column multiplexer circuits are in the form of thin-film diodes on a common substrate.

6. An electronic device according to claim 1 in which the charge storage elements of the array are photosensitive diodes.

7. An electronic device as claimed in claim 1 wherein each multiplexer circuit associated with the column conductors within a group of column conductors has individual associated supply and drain control lines.

8. An electronic device as claimed in claim 7 wherein multiplexer circuits from different groups of columns share supply and drain control lines.

9. An electronic device as claimed in claim 1 comprising an image sensor, the charge storage elements comprising photosensitive pixels.

* * * * *